(12) United States Patent
Miyagi et al.

(10) Patent No.: US 7,602,200 B2
(45) Date of Patent: Oct. 13, 2009

(54) PROBE FOR ELECTRICAL TEST COMPRISING A POSITIONING MARK AND PROBE ASSEMBLY

(75) Inventors: Yuji Miyagi, Aomori (JP); Tetsuya Iwabuchi, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 12/160,199

(22) PCT Filed: Mar. 15, 2006

(86) PCT No.: PCT/JP2006/305631

§ 371 (c)(1),
(2), (4) Date: Jul. 7, 2008

(87) PCT Pub. No.: WO2007/108110

PCT Pub. Date: Sep. 27, 2007

(65) Prior Publication Data

US 2009/0009201 A1      Jan. 8, 2009

(51) Int. Cl.
*G01R 31/02* (2006.01)
(52) U.S. Cl. ...................... 324/754; 324/758
(58) Field of Classification Search ......... 324/754–765, 324/158.1
See application file for complete search history.

(56) References Cited

U.S. PATENT DOCUMENTS

| | | | | |
|---|---|---|---|---|
| 5,177,438 A * | 1/1993 | Littlebury et al. | ............ | 324/754 |
| 6,888,261 B2 * | 5/2005 | Song et al. | ................... | 257/797 |
| 6,933,738 B2 * | 8/2005 | Martin et al. | ................ | 324/758 |
| 7,279,917 B2 * | 10/2007 | Williams et al. | ............ | 324/762 |
| 7,287,322 B2 * | 10/2007 | Mathieu et al. | ................ | 29/842 |
| 7,355,422 B2 * | 4/2008 | Walker | ........................ | 324/754 |
| 7,449,906 B2 * | 11/2008 | Miura et al. | ................. | 324/761 |
| 2003/0013340 A1 * | 1/2003 | Martin et al. | ................ | 439/488 |
| 2005/0051909 A1 * | 3/2005 | Inomata | ....................... | 257/797 |
| 2008/0197869 A1 * | 8/2008 | Miyagi et al. | ................ | 324/762 |

FOREIGN PATENT DOCUMENTS

| | | |
|---|---|---|
| JP | 1993-566510 | 9/1993 |
| JP | 2004-340654 | 12/2004 |
| JP | 2005-533263 | 11/2005 |

\* cited by examiner

*Primary Examiner*—Ha Tran T Nguyen
*Assistant Examiner*—Richard Isla Rodas
(74) *Attorney, Agent, or Firm*—Ingrassia Fisher & Lorenz, P.C.

(57) ABSTRACT

A probe for electrical test provided with positioning marks parallel to a plane where tips are provided and at a height position lower than the plane on a plane directed in the same direction as the plane, the positioning marks are in a predetermined positional relation to said tips. The positioning marks contain information indicating an existing direction of the tips when the positioning marks are observed from the projecting direction of the tips.

10 Claims, 7 Drawing Sheets

(a)

(b)

PROBE FOR ELECTRICAL TEST COMPRISING A POSITIONING MARK AND PROBE ASSEMBLY

TECHNICAL FIELD

The present invention relates to a probe suitable for use in an electrical test of a semiconductor device such as a semiconductor integrated circuit, and a probe assembly.

BACKGROUND

A semiconductor device such as a plurality of semiconductor integrated circuits formed on each chip region of a semiconductor wafer is subjected to an electrical test to determine whether or not it is manufactured as per specification. In this kind of electrical test, a probe assembly generally called "probe card" is used. This probe assembly is incorporated into a tester for electrical test, and a plurality of probes (contacts) provided in the probe assembly are pressed against corresponding electrodes of a device under test on a stage. The device under test is connected to the tester through this probe assembly and thereby undergoes an electrical test.

Since, prior to this electrical test, there is a need to have the plural probes of the probe assembly contact to the corresponding pertinent electrode of the device under test, positioning of the probe tips is performed every time the device under test is replaced. For this positioning, three probe tips located discretely on a probe board are photographed by, for example, three area sensors such as a CCD camera provided on the stage where the device under test is supported. Based on the coordinate of each tip as obtained by image processing thereof, a fine adjustment of a relative attitude between the probe assembly and the device under test is performed so that each tip may properly contact the corresponding electrode.

This probe tip, however, is prone to wearing due to contact with each electrode of the device under test and to contamination due to adhesion of scrapes of the electrode. Thus, using the probe tip as a positioning mark makes it difficult to obtain an accurate coordinate of the tip and an accurate positioning of the probe assembly.

So, forming a positioning mark at a predetermined position not to contact a device under test near each probe tip was proposed in the Official Gazette of Japanese Patent National Appln. Public Disclosure No. 2005-533263 and Patent Appln. Public Disclosure No. 2004-340654. According to them, the positioning mark for each probe, which does not contact an electrode of the device under test, is hardly worn out or contaminated. It is, therefore, possible to make accurate fine adjustment of the tip by using this mark from positioning information of the mark.

However, while such probe tips are arranged at such close intervals as several tens of pm and a probe board is defined its mounting position on a tester by positioning pins, it sometimes occurs that a mark of a predetermined probe and a mark of an adjoining probe enter an image area which each area sensor picks. In such a case, it becomes necessary to determine which of the marks is to be used for positioning. While the determination is enabled by an image processing program, a program processing for the determination becomes complicated. However, if it is possible to determine a probe attaching attitude, the determining process will be greatly facilitated.

BRIEF SUMMARY

An object of the present invention is, therefore, to provide a probe for electrical test having a mark which enables to determine an attaching attitude relatively easily.

Another object of the present invention is to provide a probe assembly having probes for electrical test with positioning marks to facilitate determining which one is the positioning mark to be adopted, in comparison with conventional ones.

The probe for electrical test according to the present invention is of a type with a positioning mark in a predetermined positional relation to the tip on a plane parallel to the surface where the tip is provided and directed in the same direction as the surface on which the tip is provided at a height position lower than the tip, and the positioning mark is characterized by containing information to indicate the existing direction of the tip when the positioning mark is observed from the projecting direction of the tip.

With the probe according to the present invention, the tip existing direction can be easily confirmed from the information on the positioning mark. To use this information, a plurality of the probes are pre-arranged, for instance, with their arrangement attitudes inverted alternately such that the positional relation between the positioning marks of adjoining probes and their tips are inverted. In case where the positioning mark for a predetermined probe to be used for the positioning is observed and, for instance, the marks for two probes including the probe are observed, information on the existing direction of each probe tip as observed is checked with the information on the existing direction of the previously given predetermined probe tip. The checking enables to easily determine which of the two observed positioning marks is the positioning mark of the predetermined probe to be adopted for positioning.

Also, the positioning mark of the probe can be used in arranging respective probes for positioning the individual probes themselves.

The probe can be provided with: a seat portion having a plane to be mounted on a support plate and rising from the mounting plane; an arm portion extending laterally from the top of the seat portion; and a front end portion connected to the arm portion. In this case, the front end portion projects from the arm portion to the opposite side of a side where the mounting plane of the seat portion is located. The tip is provided at this front end portion. Thus, the present invention is applicable without bringing about any substantial change in the constitution of the conventional system which performs positioning by observing the tips.

The positioning marks can be constituted at two mark positions formed at an interval from each other in the longitudinal direction of the arm portion. Both the mark parts are different in width dimension along the longitudinal direction of the arm portion. In this case, it is possible to easily confirm the existing direction of the tips by comparing the width directions of both mark parts.

Both the mark parts can be formed by forming a dented groove across a flat shelf plane made at the position lower than the end face of the front end portion where the tips are provided. Thus, the positioning mark containing the positional information of the tip can be relatively easily formed without such wearing or contamination as the tip.

In place of this example, the positioning mark can be formed like a one-side open rectangular shape with a pair of extended portions formed at an interval in the width direction of the arm portion and extending in the longitudinal direction of the arm and a connecting portion which connects the mutually facing ends of the extended portions.

The one-side open rectangular positioning mark can be formed by forming a cutout at the end face of the front end portion on a flat rectangular shelf face where the tips are provided on the cutout position from the central portion of the shelf face to the longitudinal edge of the arm portion and opening at the edge portion.

The probes according to the present invention can be applied to a probe assembly where the probes are to be provided.

In other words, the probe assembly according to the present invention includes a support plate and a plurality of probes to be arranged on the support plate. Each of the probes is provided with a tip and a positioning mark in a predetermined positional relation to the tip. The positioning mark is formed on the probe face directed in the same direction as the face parallel to the mounting plane where the tip is provided and at a position lower than the plane. The respective probes are supported on the support plate with their attitudes alternately inverted such that the tip positions align on an imaginary straight line on the support plate and that the positions of the respective positioning marks are located along the imaginary line alternately on its right and left sides, and the positioning marks contain information indicating the existing direction of the tips when the positioning marks are observed from the projecting direction of the tips.

According to the probe assembly according to the present invention, as in the case of the above-mentioned probes, it can be easily determined which of those positioning marks should be adopted for positioning by way of checking the information on the existing direction of the tips from a plurality of observed positioning marks and the information on the tip existing direction of the tip of the predetermined probe for use in positioning as previously given.

According to the probe of the present invention, since information on the tip position of the probe is contained in the positioning mark, it can be easily determined, by using the information on the tip position obtained from the positioning mark, as to whether the probe is the one to be used for positioning or not.

DETAILED DESCRIPTION

Figure 1:
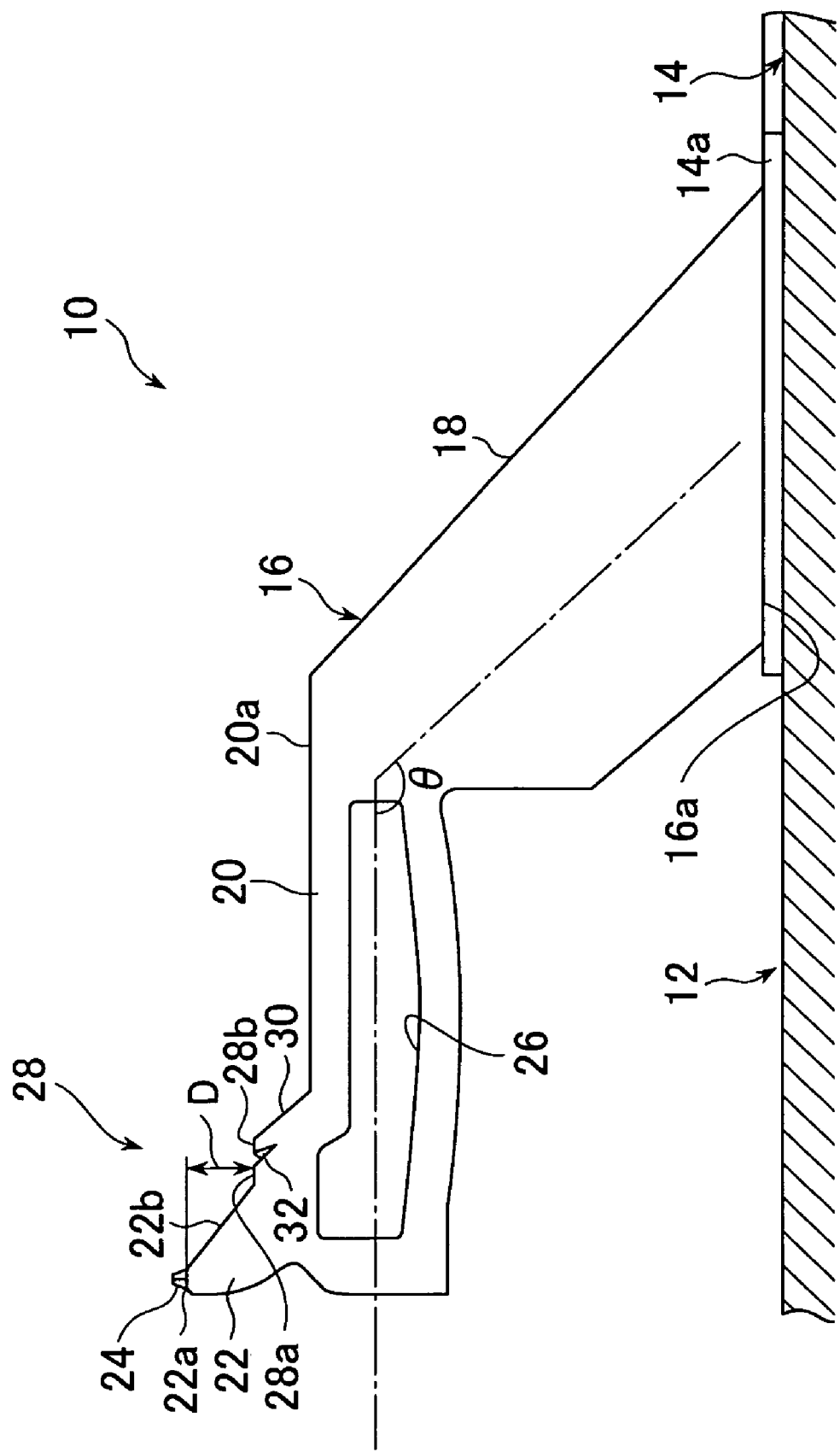
FIG. 1 is a front elevation showing the probe according to the present invention.

As shown in FIG. 1, the probe 10 according to the present invention is secured to each connection land portion 14a of the wiring 14 corresponding to each of a plurality of wirings 14 formed on a probe board which is a support plate. This probe 10 has a generally plate-like probe body 16. The probe body 16 has a flat rectangular end face 16a to be a plane for mounting the probe board 12 on each connection land portion 14a of the probe board 12; a plate-like seat portion 18 rising angularly from the end face; and an arm portion 20 extending from the front end of the seat portion 18 on a plane including the seat portion in a substantially parallel direction to the longitudinal direction of the end face 16a. At the extended end portion of the arm portion 20, a front end portion 22 rising in a direction to be away from the end face 16a of the seat portion 18 is formed, and a tip 24 is formed on its end face 22a.

The probe body 16 excluding the tip 24 is made of, for example, nickel or a metal material having a tenacity such as its alloy or phosphor bronze. In the illustration, to enhance the flexibility of the arm portion 20, a long hole 26 penetrating in the thickness direction of the arm portion and extending along the longitudinal direction of the arm portion 20 is formed.

The tip 24 can be formed integrally with the probe body of the same metal material as that of the probe body 16. However, to improve durability, it is preferable, as illustrated, to make the pyramidal tip 24 of cobalt, rhodium or a metal material of high hardness such as their alloys and to embed the tip 24 into the end face of the front end portion 22 continuous with the arm portion 20.

The side face 20a located on the opposite side of the mounting face 16a on the probe board 12 in the arm portion 20 is continuous with the inclined face 22b of the front end portion 22. In the illustration, a stage portion 30 defining a flat shelf plane 28 is formed in the vicinity of the arm portion 20 of the inclined face 22b.

Figure 2:
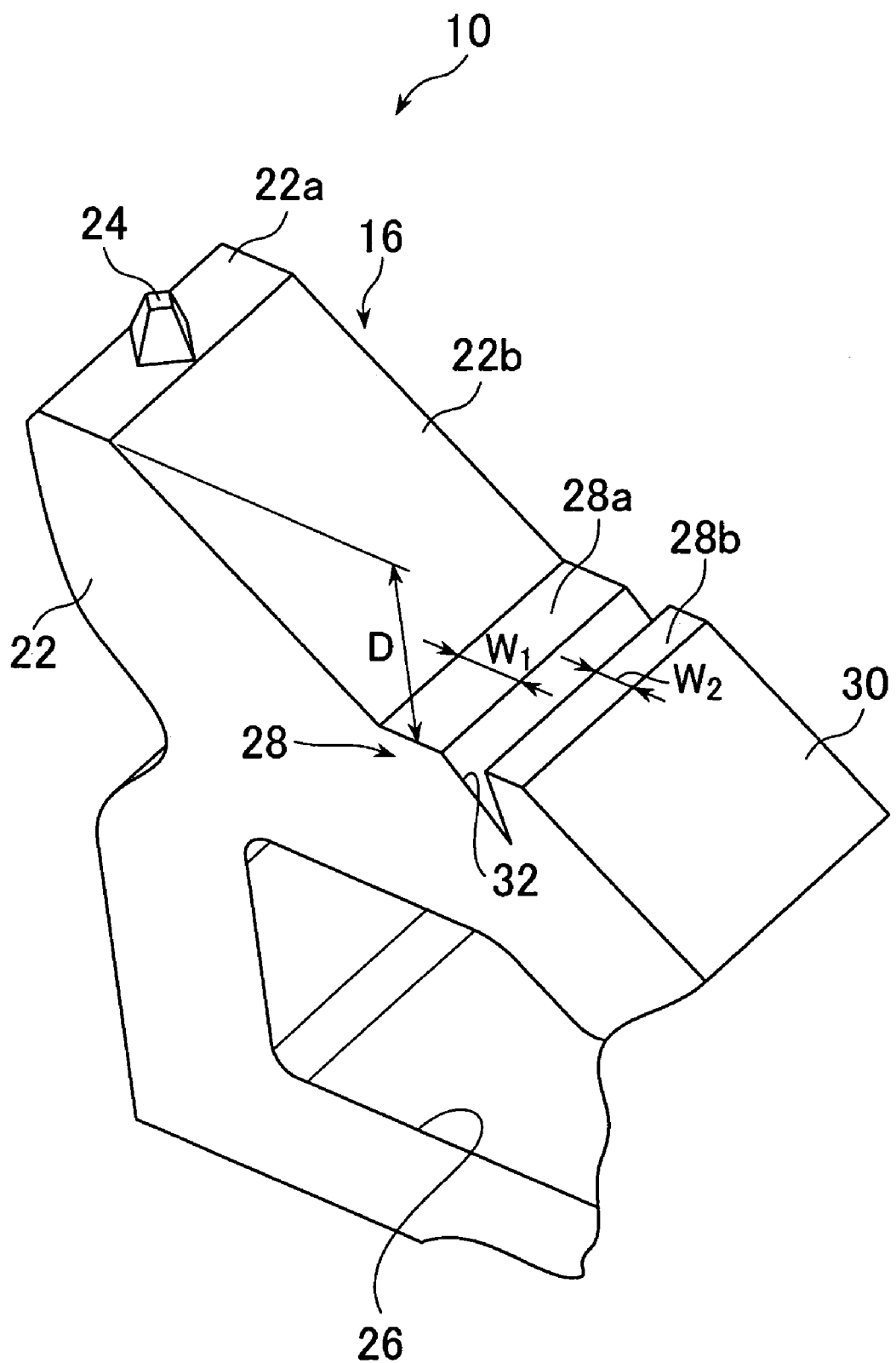
FIG. 2 is a perspective view with the probe shown in FIG. 1 partly enlarged.

The shelf face 28 is, as clearly shown at a magnification in FIG. 2, is divided into two rectangular parts 28a and 28b by a dented groove 32 extending in the thickness direction of the probe body 16. In the illustration, the dented groove 32 is a V-groove, but it may have a desired sectional shape. Each of the rectangular parts 28a, 28b has a rectangular planar shape with the thickness direction of the probe body 16 as its longitudinal direction. In the illustration, the width dimension W1 of the one rectangular part 28a located on the tip 24 side is made larger than the width dimension W2 of the other rectangular part 28b. The difference between these width dimensions W1 and W2 is desirably set to such an extent as to be easily determined instantly which width dimension is larger by an image processing of a camera shot to be mentioned later.

The shelf face 28 is formed to have a predetermined positional relation from the tip 24 so that the coordinate position of the tip 24 may be known by confirming the coordinate position, for example, of the center point thereof. Thus, the shelf face 28 can also be utilized as a positioning mark of the probe 10 itself or a positioning mark of a probe assembly to be mentioned later.

Also, being provided in the vicinity of the arm portion 20 on the inclined face 22b of the front end portion 22, the flat shelf face 28 is formed in a position lower at a distance D than the end face 22a of the front end portion 22 where the tip 24 is provided.

The shelf face 28 to be used as a positioning mark, if located at a position lower than the end face of the tip 24, can be prevented from contamination due to contact on a device under test. However, in view of surely preventing the shelf face 28 from contamination, it is desirable to place it at a sufficient height position D from the end face 22a as illustrated.

The foregoing probe body 16 can be formed as follows, for instance. First, by a photolithography to be used in a manufacturing process of semiconductor, a concave pattern imitating the planar shape of the probe body 16 as shown in FIG. 1 is formed by a photoresist on a base. Next, metal materials for the probe body 16 are deposited on the concave portion made by the resist pattern by sputtering, plating such as electroforming or the like in sequence in its thickness direction. Thereafter, the resist pattern is removed, and the probe body 16 is removed from the base.

For forming the probe body 16 having the rectangular parts 28a and 28b mentioned above, it is desirable, in view of forming the probe body 16 from a single resist pattern, to use the foregoing method of depositing in the thickness direction.

Figure 3:
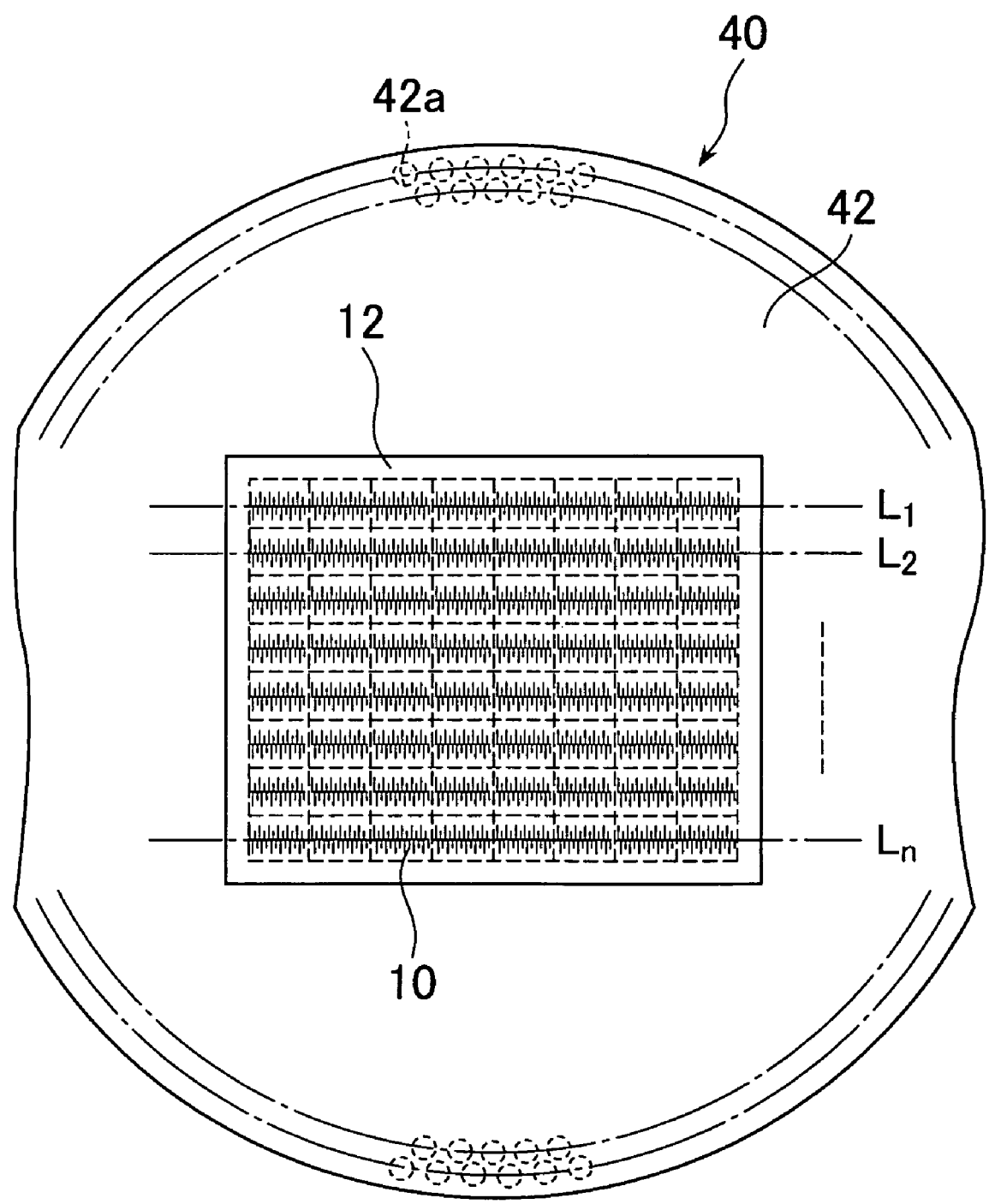
FIG. 3 is a bottom view showing a probe assembly according to the present invention.
Figure 4:
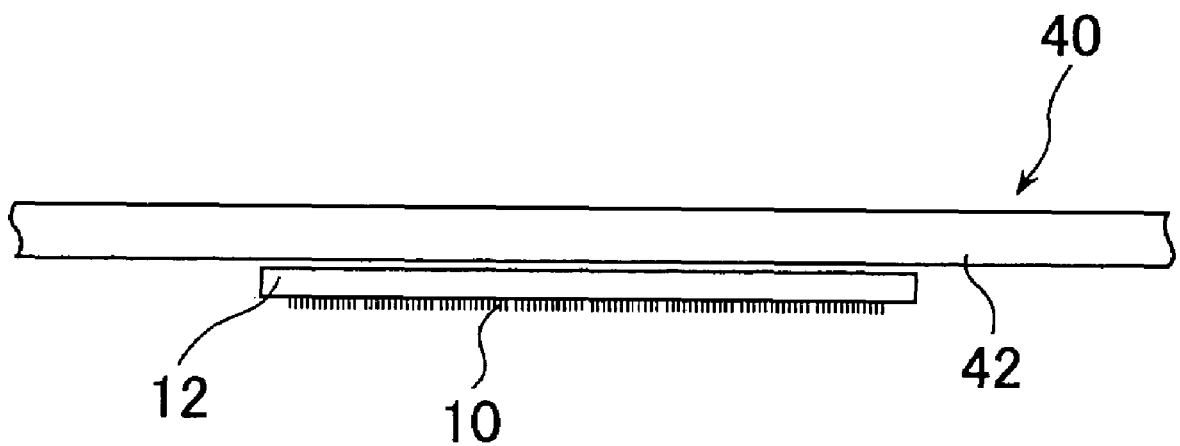
FIG. 4 is a side view showing a probe assembly according to the present invention.

FIGS. 3 and 4 show a probe assembly 40 in which the probe 10 of the present invention is used. The probe assembly 40 is applied to an electrical test of a semiconductor integrated circuit such as a plurality of semiconductor chips arranged in a matrix shape on a semiconductor wafer (not shown), for example. The probe assembly 40 comprises a circular wiring base plate 42 and a rectangular probe board 12 disposed on the underside of the wiring base plate, as shown in FIGS. 3 and 4. As shown in FIG. 3, a plurality of tester lands 42a to be connected to a tester (not shown) for electrical test are formed on the upside of the wiring base plate 42.

Figure 5:
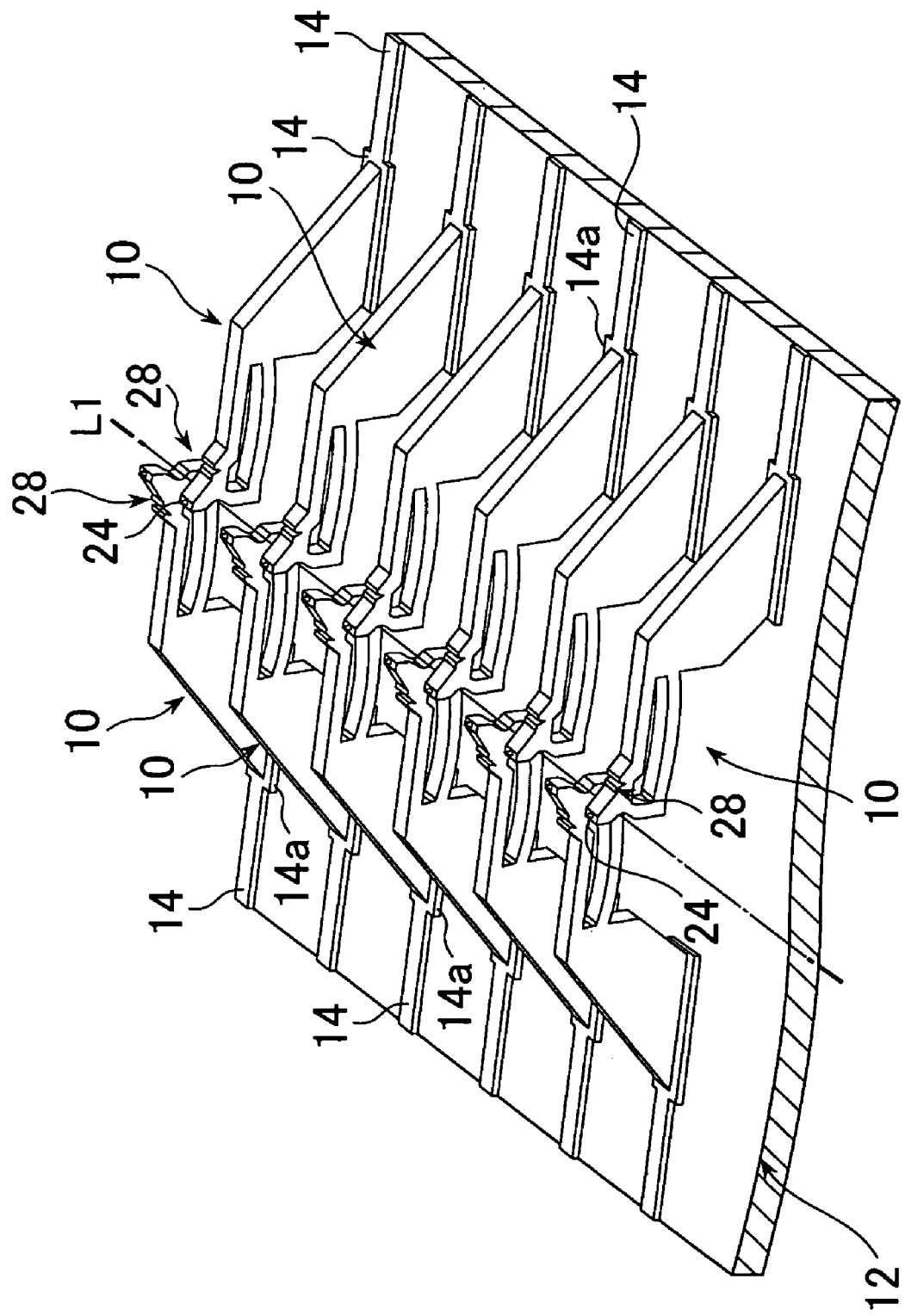
FIG. 5 is a perspective view with the probe assembly of the present invention partly enlarged.

The probe board 12, as shown in FIG. 5, has an electrical insulating plate such as ceramics, and a plurality of wirings 14 are formed on the underside of the insulating plate. Each wiring 14 is electrically connected to the corresponding tester land 42a (see FIG. 3). The probes 10 are respectively secured, for example by using a solder, to a connection land portion 14a formed in each wiring 14.

As shown in FIGS. 3 and 5, the above-mentioned multiple probes 10 are arranged such that the tips 24 align along multiple parallel imaginary straight lines L1-Ln and are inserted onto the straight lines L1-Ln alternately from both sides of the straight lines L1-Ln.

In the foregoing adhesion of the probes 10 by the solder, a laser beam can be applied to melt the solder. In this case, it becomes possible to arrange the tips 24 of the plural probes 10 close to each other without causing any damage to adjoining probes 10 by the laser beam.

The probes 10 arranged with their tips 24 aligned on the respective straight lines L1-Ln according to this alternate arrangement are disposed with their arrangement attitudes alternately inverted so that the positional relation between the flat shelf face 28 as the positioning marks of the probes 10 adjacent to each other on the L1-Ln and the tips 24 may be inverted alternately.

The probe assembly 40 according to the present invention is used for an electrical test of each chip region formed on a semiconductor wafer. For this test, the semiconductor wafer as a device under test is positioned on a stage (xyzθ stage), not shown but well known, such that the electrode in each chip region on the semiconductor wafer is directed upward. On the other hand, the probe assembly 40 is disposed in the tester at a position above the stage so that the tip 24 of each probe 10 may face the electrode of each chip region. At this time, the probe assembly is positioned in the tester by a positioning pin. However, in order to bring the tip 24 of each probe 10 of the probe assembly 40 properly into contact with each corresponding electrode, the shelf faces 28 of the predetermined three probes 10 respectively corresponding, for example, to three CCD cameras 44 are thereafter photographed as positioning marks by the three CCD cameras 44 installed dispersedly on the stage (one of them is shown in the drawing), as shown in FIG. 6(a).

The photographed images undergo data processing by a well-known image processing method. By this data processing, for example, the coordinate (x1, y1) of the central position of the flat shelf face 28 obtained from each photographed image 46 is obtained, as shown in FIG. 6(b), and from each coordinate (x1, y1) of the central position, the coordinates (x, y) of the tips 24 of the three probes 10 are obtained. The stage is fine-adjusted so as to make the coordinates of the three positions as actually measured coincide with the predetermined three coordinates. After positioning by use of the shelf face of the probe 10, i.e., the mark 28, the probe assembly 40 is descended toward the semiconductor wafer. Prior to this descent, positioning of the probe assembly 40 has already been done by the foregoing fine adjustment, so that the tips of all the probes 10 can be properly brought into contact with the corresponding electrodes. This enables a proper electrical test of each chip region of the semiconductor wafer.

The coordinate (x1, y1) of the central position of the flat shelf face of each probe 10 mentioned above can be used for obtaining the coordinate position of the tip 24 of the corresponding probe 10 or for confirming it.

Figure 6:
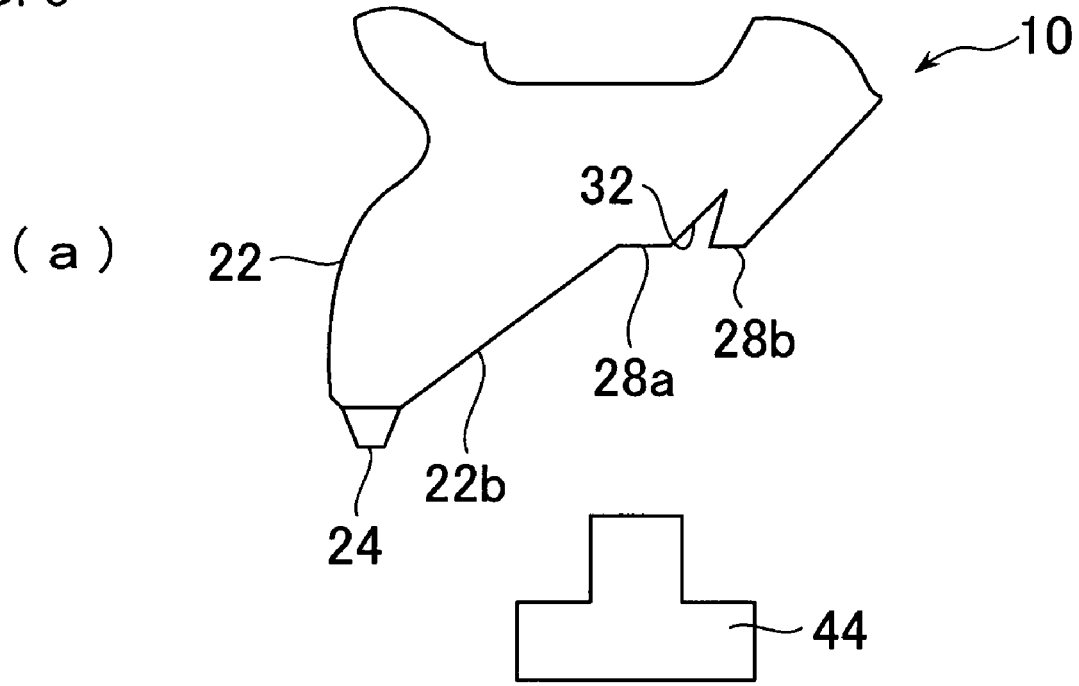
FIG. 6 is an explanatory view for explaining a determination process of the tip position of the probe according to the positioning mark provided in the probe of the probe assembly according to the present invention, in which (a) roughly explains the relation between a CCD camera and the positioning mark; and (b) explains a part of photographed images obtained by the CCD camera.
Figure 6:
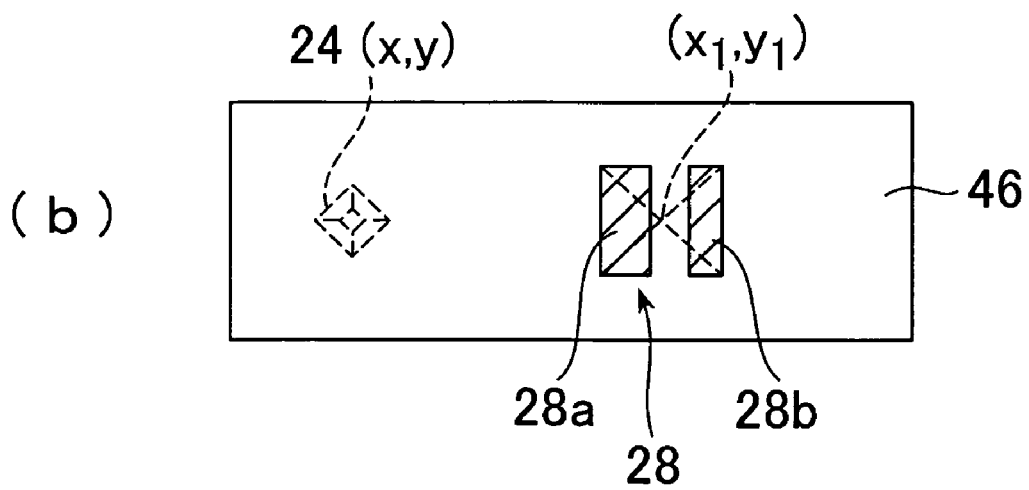

As shown in FIG. 6(b), prompt and proper positioning becomes possible, if only the positioning mark 28 of the predetermined probe 10 taken by each CCD camera is in the photographed image 46. However, due to an error in mounting the probe assembly 40 on the tester, both marks 28 of the predetermined probe 10 and another probe 10 adjacent thereto are sometimes taken into one image area.

In the probe assembly 40 according to the present invention, as mentioned above, the probes 10 to be disposed on the probe board 12 are arranged with their arrangement attitudes inverted alternately so that the positional relation between the positioning marks 28 of the probes 10 adjacent to each other on the lines L1-Ln and their tips 24 may be inverted alternately. Therefore, even when the marks 28 of the adjoining probes 10 are taken into one photographed image, if the attitudes, i.e., of the predetermined probes 10 used for positioning, that is, the positions in the aforementioned tip direction are previously grasped, the position or the attitude in the tip direction of each probe 10 within the photographed image can be discriminated, and the attitude of each discriminated probe 10 is compared with the attitude of the probe 10 to be used for positioning, thereby enabling to determine promptly which information of the mark 28 should be adopted as the positioning information.

Thus, without requiring such a complicated program processing as the conventional one, the proper mark 28 can be identified by a comparatively simple determination method based on binary judgment on the attitudes of the probes 10.

Figure 7:
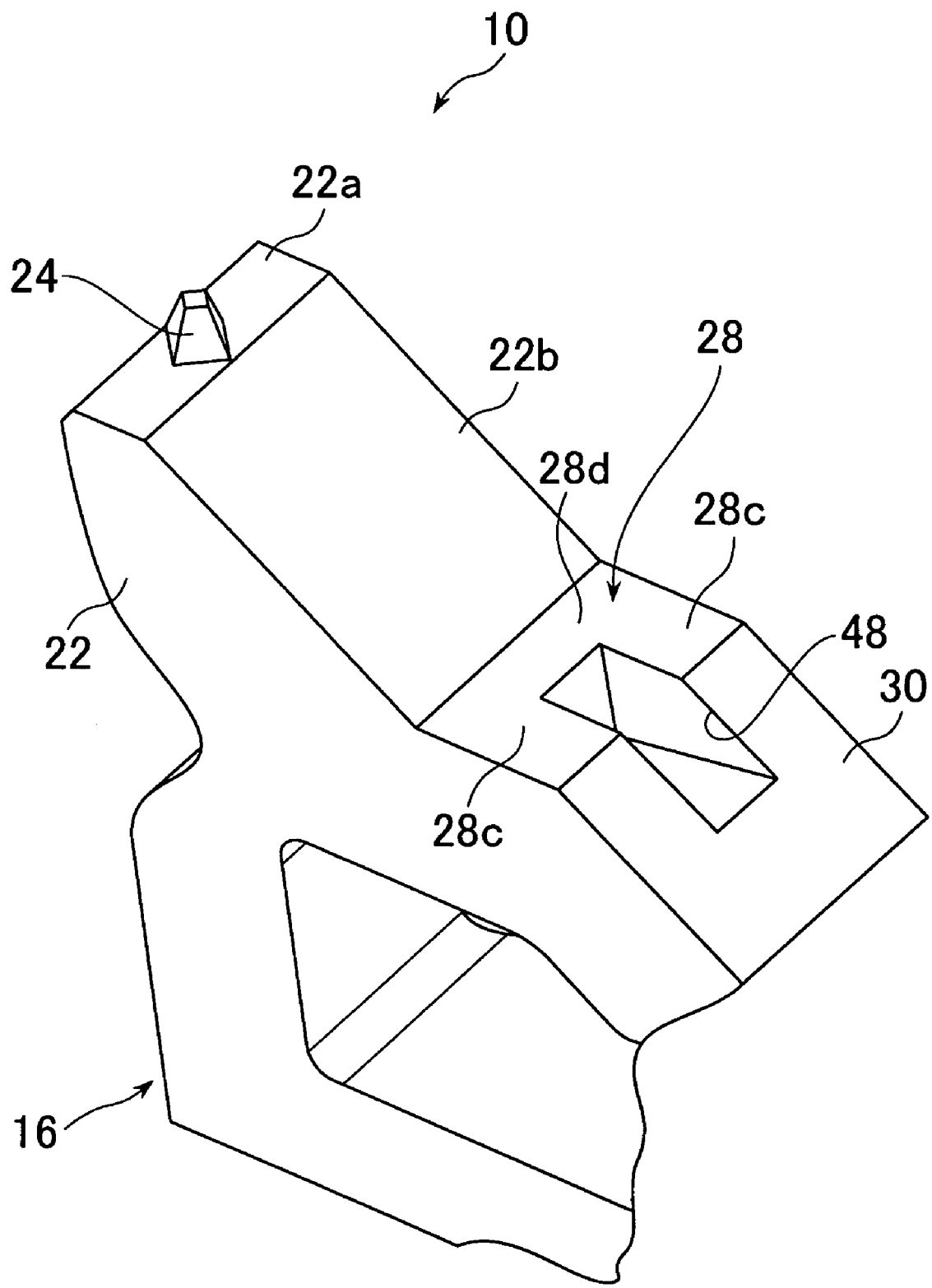
FIG. 7 is a view similar to FIG. 2 showing another embodiment of the present invention.

As shown in FIG. 7, it is possible to form a concave portion 48 on the flat rectangular shelf face 28 formed by a stage portion 30 of the inclined face 22b of the front end portion 22, the concave portion 48 reaching from the central portion of the shelf face to the edge portion in the longitudinal direction of the arm portion 20 and opening in the edge portion. Thereby, a one-side open rectangular mark constituted by a pair of extended portions 28c extending in the longitudinal direction of the arm portion at an interval from each other in the width direction of the arm portion 20 and a connecting portion 28d connecting the mutually facing end portions of the extended portion can be formed with the shelf face 28.

In the embodiment shown in FIG. 7, it can be determined that the side opposite to the direction for the one-side open rectangular shape shown by the mark 28 to open, namely, the side where the connecting portion 28d exists is to be the existing direction of the tip 24.

The embodiment shown in FIG. 7 is advantageous for the photoresist pattern formation when the probe body 16 is formed by depositing the metal materials sequentially in the height direction of the probe body 16 from the mounting face 16a toward the end face 22a.

While the present invention was explained in the above following the example of forming the shelf face 28 at the front end portion 22, it is possible to form the mark face as mentioned above in the arm portion 20 of the probe 10 or at another portion which can keep a predetermined positional relation to the tip 24.

The present invention is not limited to the foregoing embodiments but can be variously modified without departing from its purport.

The invention claimed is:

1. A probe for electrical test, characterized in that a positioning mark is provided on a second plane that is parallel to a first plane, the first plane provided with a tip, said second plane being directed in the same direction as said first plane, said second plane located at a height position lower than said tip and lower than said first plane, and further characterized in that the positioning mark contains information indicating the existing direction of the tip when the positioning mark is observed from the projecting direction of the tip, the probe comprising:

a seat portion having a mounting face configured for mounting to a support plate, the seat portion extending from said mounting face to a top of the seat portion;

an arm portion extending laterally from the top of the seat portion; and a front end portion projecting from said arm portion to the opposite side of the side where said mounting face of the seat portion is positioned, wherein said tip is provided in said front end portion and said positioning mark is provided at said front end portion of said arm portion, wherein said positioning mark has two mark parts formed at an interval from each other in the longitudinal direction of said arm portion and wherein both mark parts have different width dimensions along the longitudinal direction of said arm portion.

2. A probe described in claim 1, wherein both mark parts are formed on a flat shelf face of a stage portion that is formed at a height position lower than an end face of said front end portion where said tip is formed, and wherein said mark parts are divided from each other by a dented groove crossing said shelf face.

3. A probe for electrical test, characterized in that a positioning mark is provided on a second plane that is parallel to a first plane, the first plane provided with a tip, said second plane being directed in the same direction as said first plane, said second plane located at a height position lower than said tip and lower than said first plane, and further characterized in that the positioning mark contains information indicating the existing direction of the tip when the positioning mark is observed from the projecting direction of the tip, the probe comprising:

a seat portion having a mounting face configured for mounting to a support plate, the seat portion extending from said mounting face to a top of the seat portion;

an arm portion extending laterally from the top of the seat portion; and a front end portion projecting from said arm portion to the opposite side of the side where said mounting face of the seat portion is positioned, wherein said tip is provided in said front end portion and said positioning mark is provided at said front end portion of said arm portion, wherein said positioning mark presents a one-side open rectangular shape which is constituted by a pair of extended portions formed at an interval from each other in the width direction of the arm portion and extending in the longitudinal direction of said arm portion, and a connecting portion connecting mutually facing edge portions of said extended portion.

4. A probe described in claim 3, wherein said positioning mark is formed on a flat shelf face of a stage portion of said front end portion where said tip is provided, and at a height position lower than an end face of said front end portion, and wherein said positioning mark is made into a one-side open rectangular shape by a recess reaching from the central portion of said shelf face to an edge portion in the longitudinal direction of said arm portion to open at said edge portion.

5. A probe assembly comprising a support plate on which a wiring circuit is formed, and a plurality of probes arranged on said support plate, wherein each probe is provided with a tip and a positioning mark in a predetermined positional relation, said positioning mark being formed on a second plane that is parallel to a first plane, the tip being located on said first plane, and said second plane being directed in the same direction as said first plane at a height position lower than said tip, wherein said probes are supported with their tip positions aligned on an imaginary straight line on said support plate such that the positions of the respective positioning marks are located along said imaginary line on its right and left sides alternately and with their attitudes inverted alternately, and characterized in that said positioning marks contain information to indicate the existing direction of said tips when said positioning marks are observed from the projecting direction of said tips.

6. A probe assembly described in claim 5, wherein each of said probes comprises a seat portion having a mounting plane on said support plate, an arm portion extending laterally from the top of said seat portion, and a front end portion projecting from said arm portion to an opposite side of a side where said mounting plane of said seat portion is located, wherein said tip is provided at said front end portion, and wherein said positioning mark is provided in said front end portion of said arm portion.

7. A probe assembly described in claim 6, wherein said positioning mark has two mark parts formed at an interval from each other in the longitudinal direction of said arm portion, and wherein both said mark parts have different width dimensions along the longitudinal direction of said arm portion.

8. A probe assembly described in claim 7, wherein both said mark parts are formed on a flat shelf face of a stage portion formed at a height position lower than the end face of said front end portion where said tips are provided and are divided from each other by a dented groove across said shelf face.

9. A probe assembly described in claim 6, wherein said positioning mark presents a one-side open rectangular shape which is constituted by a pair of extended portions formed at an interval from each other in the width direction of the arm portion and extending in the longitudinal direction of said arm portion, and a connecting portion connecting mutually facing edge portions of said extended portion.

10. A probe assembly described in claim 9, wherein said positioning marks are formed on a flat shelf face of a stage portion formed at a height position lower than the end face of said front end portion where said tips are provided and present a one-side open rectangular shape constituted by a recess reaching from the central portion of said shelf face to a longitudinal edge portion of said arm portion and opening at said edge portion.

* * * * *